United States Patent
Chida

(10) Patent No.: US 8,253,343 B2
(45) Date of Patent: Aug. 28, 2012

(54) DRIVE CIRCUIT TO ADJUST A LUMINANCE OF A LIGHT EMITTING ELEMENT BASED ON A PWM SIGNAL, AND A PORTABLE INFORMATION TERMINAL INCLUDING THE DRIVE CIRCUIT

(75) Inventor: Taisuke Chida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/899,990

(22) Filed: Oct. 7, 2010

(65) Prior Publication Data

US 2011/0025227 A1 Feb. 3, 2011

Related U.S. Application Data

(63) Continuation of application No. 11/913,730, filed as application No. PCT/JP2006/310653 on May 29, 2006, now Pat. No. 7,825,604.

(30) Foreign Application Priority Data

Jun. 3, 2005 (JP) .................................. 2005-164146

(51) Int. Cl.
*H05B 39/00* (2006.01)
(52) U.S. Cl. .................. 315/209 R; 315/209 T; 315/226
(58) Field of Classification Search .................... 315/88, 315/89, 91, 93, 119, 127, 128, 185 R, 186, 315/209 R, 209 T, 210, 217, 226, 291, 294, 315/295, 297, 299, 300, 301, 307, 308, 312, 315/313, 320, 362
See application file for complete search history.

(56) References Cited

U.S. PATENT DOCUMENTS

| | | | |
|---|---|---|---|
| 3,697,860 A | 10/1972 | Baker | |
| 4,301,393 A | 11/1981 | Shoji et al. | |
| 6,222,357 B1 | 4/2001 | Sakuragi | |
| 2005/0001685 A1* | 1/2005 | Nakayama et al. | 330/284 |
| 2005/0206323 A1* | 9/2005 | Hayakawa et al. | 315/209 R |
| 2005/0217457 A1* | 10/2005 | Yamamoto et al. | 84/464 R |

FOREIGN PATENT DOCUMENTS

| | | |
|---|---|---|
| JP | 01-294070 A | 11/1989 |
| JP | 5-102821 A | 4/1993 |
| JP | 05-335911 A | 12/1993 |
| JP | 06-120599 | 4/1994 |
| JP | 07-321623 | 12/1995 |
| JP | 2001-326703 | 11/2001 |
| JP | 2003-202541 | 7/2003 |

* cited by examiner

Primary Examiner — Douglas W Owens
Assistant Examiner — Jianzi Chen
(74) Attorney, Agent, or Firm — Fish & Richardson P.C.

(57) ABSTRACT

A drive circuit (100) includes an operational amplifier (OP1) that compares a voltage applied to an inverting input terminal with a reference voltage applied to a non-inverting input terminal, a MOS transistor (M1) that has an output connected to the inverting input terminal of the operational amplifier (OP1) and supplies a current to a load (3) depending on a comparison result of the operational amplifier (OP1), and a switch (SW1) that switches, based on a control signal, between outputting the comparison result of the operational amplifier (OP1) to the MOS transistor (M1) and outputting a predetermined voltage to the MOS transistor (M1) to turn off the MOS transistor (M1).

15 Claims, 4 Drawing Sheets

DRIVE CIRCUIT TO ADJUST A LUMINANCE OF A LIGHT EMITTING ELEMENT BASED ON A PWM SIGNAL, AND A PORTABLE INFORMATION TERMINAL INCLUDING THE DRIVE CIRCUIT

CROSS-REFERENCE TO RELATED APPLICATIONS

This application is a continuation of (and claims the benefit of priority to) U.S. application Ser. No. 11/913,730, filed on Nov. 6, 2007, which claims the benefit of Japanese patent application no. 2005-164146 filed Jun. 3, 2005, the disclosures of which are hereby incorporated by reference in their entirety.

TECHNICAL FIELD

The present invention relates to a drive circuit and a portable information terminal including the same, and more particularly, to a drive circuit supplying a current to a load based on a control signal and a portable information terminal including the same.

BACKGROUND ART

Portable information terminals such as mobile phones and PDAs (Personal Data Assistant) use LED (Light-Emitting Diode) elements for various purposes. For example, LED elements are used as backlight for an LCD (Liquid Crystal Display) and flash for a camera employing a CCD (Charge-Coupled Device). In addition, LED elements having different emission colors are blinked as illumination.

A method for adjusting a luminance of an LED by PWM (Pulse Width Modulation) control has been known. This is a method to adjust the luminance of the LED by changing a pulse width (duration) of a current flowing through the LED, i.e., by changing a duty cycle of the pulse of the current flowing through the LED.

For example, Japanese Patent Laying-Open No. 7-321623 (Patent Document 1) discloses a drive circuit (MOS (metal oxide semiconductor) drive circuit) as described below. More specifically, a MOS drive circuit for driving a light emitting or a display array having a plurality of current-driven elements connected in parallel includes a MOS array having a plurality of MOS elements connected in parallel and supplying a driving current to each current driven element, a switching circuit separately and independently provided for each MOS element, a voltage source for supplying a control voltage to each MOS element via each switching circuit, and an operational amplifier provided between the voltage source and the switching circuit.

Patent Document 1: Japanese Patent Laying-Open No. 7-321623

DISCLOSURE OF THE INVENTION

Problems to be Solved by the Invention

In the PWM control as described above, supply of a predetermined current to an LED is necessary to obtain a desired luminance. In the drive circuit disclosed in Patent Document 1, however, the current supplied to a load such as an LED tends to vary since variation in a forward voltage (Vf) of the LED and characteristics of a transistor due to the temperature or the like causes variation in an output voltage of the transistor.

Therefore, an object of the present invention is to provide a drive circuit that can prevent variation in a current supplied to a load, and a portable information terminal including the same.

Means for Solving the Problems

A drive circuit according to an aspect of the present invention is a drive circuit that supplies a current to a load based on a control signal, including an operational amplifier that compares a voltage applied to a first input terminal with a reference voltage applied to a second input terminal, a first transistor that supplies a current to the load depending on a comparison result of the operational amplifier, a second transistor that outputs a current depending on the comparison result of the operational amplifier, a first switch that switches, based on the control signal, between outputting the comparison result of the operational amplifier to the first transistor and outputting a predetermined voltage to the first transistor to turn off the first transistor, and a second switch that switches, based on the control signal, between connecting an output of the first transistor to the first input terminal of the operational amplifier and connecting an output of the second transistor to the first input terminal of the operational amplifier.

Preferably, the drive circuit further includes a third switch that switches, based on the control signal, between outputting the comparison result of the operational amplifier to the second transistor and outputting the predetermined voltage to the second transistor to turn off the second transistor.

Preferably, the drive circuit further includes a first resistor that is connected to the output of the first transistor and a second resistor that is connected to the output of the second transistor, and a resistance value of the second resistor is larger than the resistance value of the first resistor.

Preferably, the drive circuit further includes a D/A converter that changes the reference voltage based on input data and applies the changed reference voltage to the second input terminal of the operational amplifier.

Preferably, the load is a light emitting element used as backlight for a field sequential display device.

A portable information terminal according to an aspect of the present invention is a portable information terminal having a drive circuit that supplies a current to a load based on a control signal, and the drive circuit includes an operational amplifier that compares a voltage applied to a first input terminal with a reference voltage applied to a second input terminal, a first transistor that supplies a current to the load depending on a comparison result of the operational amplifier, a second transistor that outputs a current depending on the comparison result of the operational amplifier, a first switch that switches, based on the control signal, between outputting the comparison result of the operational amplifier to the first transistor and outputting a predetermined voltage to the first transistor to turn off the first transistor, and a second switch that switches, based on the control signal, between connecting an output of the first transistor to the first input terminal of the operational amplifier and connecting an output of the second transistor to the first input terminal of the operational amplifier.

A drive circuit according to another aspect of the present invention is a drive circuit that supplies a current to a load based on a control signal, including an operational amplifier that compares a voltage applied to a first input terminal with a reference voltage applied to a second input terminal, a transistor that has an output connected to the first input terminal of the operational amplifier and supplies a current to the load depending on a comparison result of the operational amplifier, and a switch that switches, based on the control signal, between outputting the comparison result of the operational amplifier to the transistor and outputting a predetermined voltage to the transistor to turn off the transistor.

Effects of the Invention

With the present invention, variation in the current supplied to the load can be prevented.

DESCRIPTION OF THE REFERENCE SIGNS

Figure 1:
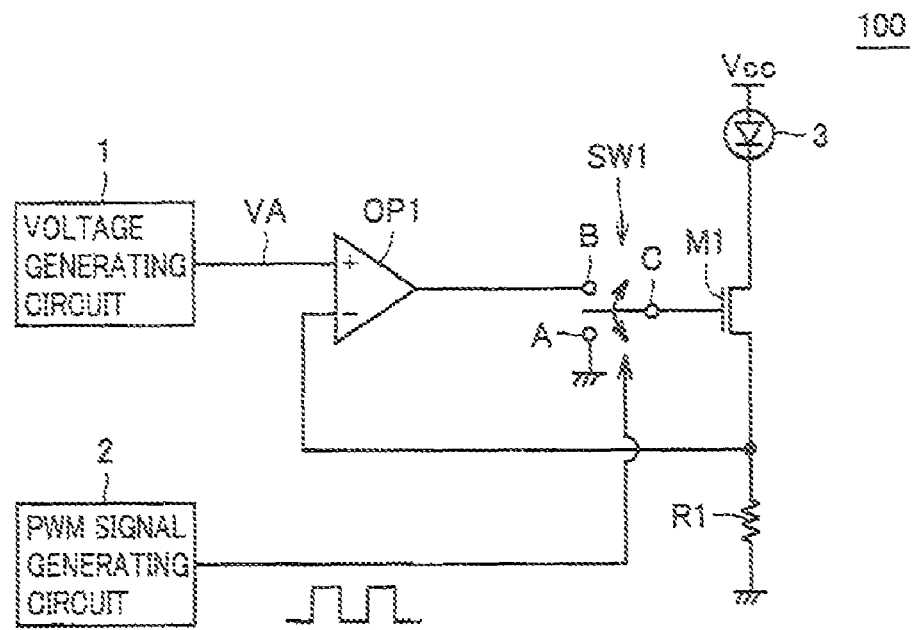
FIG. 1 is a diagram showing a configuration of a drive circuit according to a first embodiment of the present invention.

SW1-SW3, SW-5 switch, OP1 operational amplifier, M1-M2, M5 MOS transistor, M3-M4 bipolar transistor, R1-R2 resistor, t1-t2 terminal, 1 voltage generating circuit, 2 PWM signal generating circuit, 3 load, 4 D/A converter, 5 inverter, 11 operation portion, 12 light emitting portion, 13 processing block, 14 communication processing portion, 15 LCD monitor, 21 LED, 22 processing portion, 23 CPU, 24 memory, 31-32, 100 drive circuit, 200 semiconductor integrated circuit, 300 portable information terminal

BEST MODES FOR CARRYING OUT THE INVENTION

Hereinafter, embodiments of the present invention will be described referring to the drawings. To note, in the drawings, the same reference characters refer to the same or corresponding elements and description thereof will not be repeated here.

First Embodiment

Configuration and Basic Operation

FIG. 1 is a diagram showing a configuration of a drive circuit according to a first embodiment of the present invention. Referring to FIG. 1, a drive circuit 100 includes a switch SW1, an operational amplifier OP1, an NMOS type MOS transistor M1, a resistor R1, a voltage generating circuit 1 and a PWM signal generating circuit 2.

MOS transistor M1 has a gate connected to a terminal C of switch SW1, a drain connected to one end of load 3 and a source connected to one end of resistor R1 and a negative input terminal (inverting input) of operational amplifier OP1.

Hereinafter, description will be given assuming that load 3 is an LED, however, load 3 may be a light emitting element other than an LED, or may be an electronic circuit driven by a current.

Operational amplifier OP1 has a positive input terminal (non-inverting input) connected to an output of voltage generating circuit 1, and an output terminal connected to a terminal B of switch SW1.

A terminal A of switch SW1 and the other end of resistor R1 are connected to a ground voltage. A fixed voltage Vcc is connected to the other end of load 3.

Resistor R1 is a resistor for converting a drain current of MOS transistor M1 to a voltage. PWM signal generating circuit 2 outputs a PWM control signal to switch SW1.

Operational amplifier OP1 compares a reference voltage VA received from voltage generating circuit 1 with an output voltage received from MOS transistor M1, i.e. a voltage at one end of resistor R1 to output a comparison voltage representing a comparison result to the gate of MOS transistor M1 via switch SW1.

MOS transistor M1 outputs a drain current depending on the comparison voltage received from operational amplifier OP1. More specifically, MOS transistor M1 supplies the drain current to load 3.

Based on the PWM control signal received from PWM signal generating circuit 2, switch SW1 switches between outputting the comparison voltage received from operational amplifier OP1 to the gate of MOS transistor M1 and outputting the ground voltage to the gate of MOS transistor M1.

[Operation]

Then, operation in PWM control for an LED by the drive circuit according to the present embodiment will be described.

When a logical level of the PWM control signal is "H", terminal B and terminal C of switch SW1 are connected.

At this stage, the comparison voltage output from operational amplifier OP1 is input to the gate of MOS transistor M1. Then, MOS transistor M1 outputs the drain current depending on the comparison voltage. Accordingly, the drain current of MOS transistor M1 is supplied to the LED to bring the LED into an illuminating state. Then, an output voltage generated at resistor R1 by the drain current of MOS transistor M1 is input to the negative input terminal of operational amplifier OP1. Thus, a negative feedback circuit is formed between operational amplifier OP1 and MOS transistor M1, and the voltage at the negative input terminal of operational amplifier OP1, i.e. the output voltage of MOS transistor M1 converges to reference voltage VA. Therefore, MOS transistor M1 can supply a predetermined drain current corresponding to output voltage VA to the LED.

In contrast, when the logical level of the PWM control signal is "L", terminal A and terminal C of switch SW1 are connected.

In this case, the ground voltage is input to the gate of MOS transistor M1 to turn off MOS transistor M1, bringing the LED into a non-illuminating state. Accordingly, the logical state of the PWM control signal alternates between "H" and "L" so that the LED alternates between the illuminating state and the non-illuminating state.

In the drive circuit disclosed in Patent Document 1, since variation in a forward voltage (Vf) of an LED and characteristics of a transistor due to the temperature or the like causes variation in the output voltage of the transistor, the current supplied to a load such as an LED tends to vary. In the drive circuit according to the present embodiment, however, when the LED illuminates, i.e. when MOS transistor M1 is turned on, a negative feedback circuit is formed between operational amplifier OP1 and MOS transistor M1 and the output voltage of MOS transistor M1 converges to reference voltage VA. Accordingly, even if the forward voltage of an LED as load 3 and characteristics of MOS transistor M1 vary due to the temperature or the like, the output voltage of MOS transistor M1 when the LED illuminates converges to reference voltage VA. Therefore, in the drive circuit according to the present embodiment, variation in the current supplied to the load can be prevented.

Modification of the First Embodiment

Then, a modification of the present embodiment will be described with reference to the drawings. In the drawings, the same reference characters refer to the same or corresponding elements and description thereof will not be repeated here.

Figure 2:
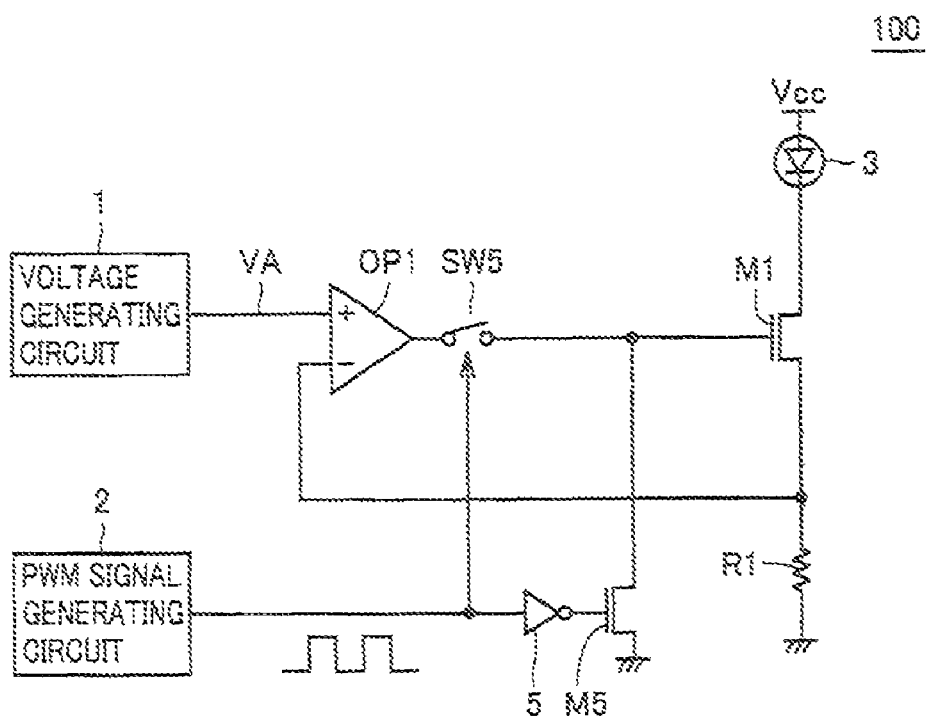
FIG. 2 is a diagram showing a configuration of a modification of the drive circuit according to the first embodiment of the present invention.

FIG. 2 is a diagram showing a configuration of a modification of the drive circuit according to the first embodiment of the present invention. Referring to FIG. 2, drive circuit 100 includes a switch SW5 instead of switch SW1, a NMOS type MOS transistor M5 and an inverter 5, as compared with the drive circuit of the first embodiment.

MOS transistor M1 has a gate connected to one end of switch SW5 and a drain of MOS transistor M5, a drain connected to one end of load 3, and a source connected to one end of resistor R1 and the negative input terminal (inverting input) of operational amplifier OP1.

Operational amplifier OP1 has a positive input terminal (non-inverting input) connected to the output of voltage generating circuit 1 and an output terminal connected to the other end of switch SW5. MOS transistor M5 has a gate connected to an output of inverter 5.

The other end of resistor R1 and a source of MOS transistor M5 are connected to the ground voltage. Fixed voltage Vcc is connected to the other end of load 3.

PWM signal generating circuit 2 outputs a PWM control signal to switch SW5 and inverter 5.

Operational amplifier OP1 compares reference voltage VA received from voltage generating circuit 1 with the output voltage received from MOS transistor M1, i.e. the voltage at one end of resistor R1 to output a comparison voltage representing a comparison result to the gate of MOS transistor M1 via switch SW5.

Switch SW5 switches between ON and OFF states based on the PWM control signal received from PWM signal generating circuit 2. In the ON state of switch SW5, the comparison voltage output from operational amplifier OP1 is output to the gate of MOS transistor M1.

[Operation]

Then, operation in PWM control for an LED by the drive circuit according to the present embodiment will be described.

When the logical level of the PWM signal is "H", switch SW5 is turned on. Since a PWM signal having a logical level inverted by inverter 5 is input to the gate of MOS transistor M5, MOS transistor M5 is turned off.

Accordingly, as in the drive circuit according to the first embodiment, the drain current of MOS transistor M1 is supplied to the LED to cause the LED to illuminate while a negative feedback circuit is formed between operational amplifier OP1 and MOS transistor M1 so that the output voltage of MOS transistor M1 converges to reference voltage VA.

In contrast, when the logical level of the PWM control signal is "L", switch SW5 is turned off. Since a PWM control signal having a logical level inverted by inverter 5 is input to the gate of MOS transistor M5, MOS transistor M5 is turned on.

Accordingly, since the output of operational amplifier OP1 is open and MOS transistor M5 having a source connected to the ground voltage is turned on, the ground voltage is input to the gate of MOS transistor M1 so that MOS transistor M1 is turned off and the LED does not illuminate. Therefore, as in the drive circuit according to the first embodiment, the logical level of the PWM control signal alternates between "H" and "L" so that the LED alternates between the illuminating state and the non-illuminating state.

Therefore, it is found that switch SW5, NMOS type MOS transistor M5 and inverter 5 act similarly to switch SW1 in the drive circuit in the first embodiment.

Meanwhile, in the drive circuit according to the present embodiment, when the LED is not illuminating, i.e. when the transistor is turned off, the output voltage of the transistor is significantly different from the output voltage of the transistor when the LED is illuminating, so that the operating point of the operational amplifier when the LED is not illuminating is significantly distant from the operating point of the operational amplifier when the LED is illuminating. Accordingly, longer time is required for the transistor to supply a predetermined current to the LED after the LED makes the transition from the non-illuminating state to the illuminating state. In addition, when the cycle of the PWM control, i.e. the cycle of the illuminating state and the non-illuminating state of the LED is short, the transistor cannot supply the predetermined current to the LED in the illuminating state of the LED and a desired luminance cannot be obtained. Therefore, with the drive circuit according to the present embodiment, there is a problem that a predetermined current cannot be supplied to a load such as an LED in a short period of time.

Then, another embodiment that solves such a problem will be described with reference to the drawings. To note, in the drawings, the same reference characters refer to the same or corresponding elements and description thereof will not be repeated here.

Second Embodiment

Configuration and Basic Operation

Figure 3:
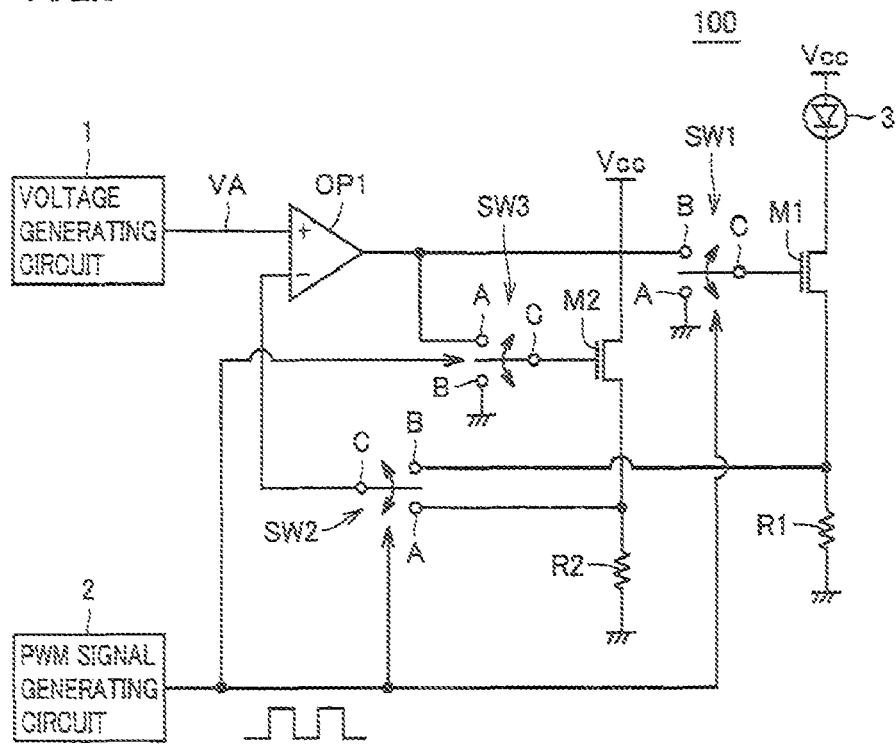
FIG. 3 is a diagram showing a configuration of a drive circuit according to a second embodiment of the present invention.

FIG. 3 is a diagram showing a configuration of a drive circuit according to a second embodiment of the present invention. Referring to FIG. 3, drive circuit 100 includes switches SW1-SW3 (first to third switches), operational amplifier OP1, NMOS type MOS transistors M1-M2 (first to second transistors), resistors R1-R2 (first to second resistors), voltage generating circuit 1, and PWM signal generating circuit 2.

MOS transistor M1 has a gate connected to terminal C of switch SW1, a drain connected to one end of load 3 and a source connected to one end of resistor R1 and terminal B of switch SW2.

Hereinafter, description will be given assuming that load 3 is an LED. However, load 3 may be a light emitting device other than an LED, or may be an electronic circuit driven by a current.

MOS transistor M2 has a gate connected to terminal C of switch SW3, a drain connected to fixed voltage Vcc and a source connected to one end of resistor R2 and terminal A of switch SW2.

Operational amplifier OP1 has a positive input terminal (non-inverting input) connected to the output of voltage generating circuit 1, a negative input terminal (inverting input)

connected to terminal C of switch SW2, and an output terminal connected to terminal B of switch SW1 and terminal A of switch SW3.

Terminal A of switch SW1, terminal B of switch SW3, the other end of resistor R1, and the other end of resistor R2 are connected to the ground voltage. Fixed voltage Vcc is connected to the other end of load 3.

Resistor R1 is a resistor for converting a drain current of MOS transistor M1 to a voltage. Resistor R2 is a resistor for converting a drain current of MOS transistor M2 to a voltage.

PWM signal generating circuit 2 outputs a PWM control signal to switches SW1-SW3. Operational amplifier OP1 compares reference voltage VA received from voltage generating circuit 1 with the output voltage received from MOS transistor M1 through switch SW2, i.e. the voltage at one end of resistor R1 or the output voltage received from MOS transistor M2 through switch SW2, i.e. the voltage at one end of resistor R2 to output a comparison voltage representing a comparison result to the gate of MOS transistor M1 and the gate of MOS transistor M2 via switch SW1 and switch SW3.

MOS transistor M1 outputs a drain current depending on the comparison voltage received from operational amplifier OP1 through switch SW1. More specifically, MOS transistor M1 supplies the drain current to load 3.

MOS transistor M2 outputs a drain current to resistor R2 depending on the comparison voltage received from operational amplifier OP1 through switch SW3.

Based on the PWM control signal received from PWM control signal generating circuit 2, switch SW1 switches between outputting the comparison voltage received from operational amplifier OP1 to the gate of MOS transistor M1 and outputting the ground voltage to the gate of MOS transistor M1.

Based on the PWM control signal received from PWM control signal generating circuit 2, switch SW3 switches between outputting the comparison voltage received from operational amplifier OP1 to the gate of MOS transistor M2 and outputting the ground voltage to the gate of MOS transistor M2.

Based on the PWM control signal received from PWM control signal generating circuit 2, switch SW2 switches between outputting the output voltage received from MOS transistor M1 to the negative input terminal of operational amplifier OP1 and outputting the output voltage generated at resistor R2 by the drain current of MOS transistor M2 to the negative input terminal of operational amplifier OP1.

[Operation]

Next, operation in PWM control for an LED by the drive circuit according to the present embodiment will be described.

When the logical level of the PWM control signal is "H", terminal B and terminal C of respective switches SW1-SW3 are connected.

At this stage, the comparison voltage output from operational amplifier OP1 is input to the gate of MOS transistor M1. Then, MOS transistor M1 outputs a drain current depending on the comparison voltage. The drain current of MOS transistor M1 is supplied to the LED to cause the LED to illuminate. The output voltage generated at resistor R1 by the drain current of MOS transistor M1 is input to the negative input terminal of operational amplifier OP1. Thus, a negative feedback circuit is formed between operational amplifier OP1 and MOS transistor M1 and the voltage of the negative input terminal of operational amplifier OP1, i.e. the output voltage of MOS transistor M1 converges to reference voltage VA. Accordingly, MOS transistor M1 can supply a predetermined drain current corresponding to output voltage VA to the LED.

In contrast, when the logical level of the PWM control signal is "L", terminal A and terminal C of respective switches SW1-SW3 are connected.

In this case, the ground voltage is input to the gate of MOS transistor M1 and MOS transistor M1 is turned off and the LED does not illuminate. Therefore, the logical level of PWM control signal alternates between "H" and "L" so that the LED alternates between the illuminating state and the non-illuminating state.

At this stage, the comparison voltage output from operational amplifier OP1 is input to the gate of MOS transistor M2. MOS transistor M2 outputs a drain current depending on the comparison voltage. Then, the output voltage of MOS transistor M2 is input to the negative input terminal of operational amplifier OP1. Thus, a negative feedback circuit is formed between operational amplifier OP1 and MOS transistor M2, and as in the illuminating state of the LED, the output voltage of MOS transistor M2, i.e. the voltage of the negative input terminal of operational amplifier OP1 converges to reference voltage VA.

In the drive circuit disclosed in Patent Document 1, since variation in the forward voltage (Vf) of the LED and characteristics of the transistor due to the temperature or the like causes variation in the output voltage of the transistor, the current supplied to the load such as an LED tends to vary. In the drive circuit according to the present embodiment, however, a negative feedback circuit is formed between operational amplifier OP1 and MOS transistor M1 and the output voltage of MOS transistor M1 converges to reference voltage VA. Accordingly, even when the forward voltage of the LED as load 3 and characteristics of MOS transistor M1 vary due to the temperature or the like, the output voltage of MOS transistor M1 always converges to reference voltage VA. Therefore, in the drive circuit according to the present embodiment, variation in the current supplied to the load can be prevented.

In addition, in the drive circuit according to the first embodiment, the output voltage of the transistor when the LED is not illuminating is significantly different from the output voltage of the transistor when the LED is illuminating, so that the operating point of the operational amplifier when the LED is not illuminating is significantly distant from the operating point of the operational amplifier when the LED is illuminating. Therefore, longer time is required for the transistor to supply a predetermined current to the LED after the LED makes the transition from the non-illuminating state to the illuminating state. In the drive circuit according to the present embodiment, however, even when the LED is not illuminating, a negative feedback circuit is formed between operational amplifier OP1 and MOS transistor M2 and the voltage of the negative input terminal of operational amplifier OP1 converges to reference voltage VA. Accordingly, it can be prevented that the operating point of the operational amplifier when the LED is not illuminating is significantly distant from the operating point of the operational amplifier when the LED is illuminating, and a predetermined current can be supplied to the LED in a short period of time after the LED makes the transition from the non-illuminating state to the illuminating state.

Thus, in the drive circuit according to the present embodiment, variation in the current supplied to the load can be prevented while a predetermined current can be supplied to the load in a short period of time.

To note, the resistance value of resistor R2 can be configured to be larger than the resistance value of resistor R1. With such a configuration, the current value of the drain current of MOS transistor M2 that does not have to be a particularly large current can be made smaller, reducing the power consumption of the drive circuit. For example, when the resistance value of resistor 1 is 1Ω and the resistance value of resistor R2 is 2.5 kΩ, the voltage of the negative input terminal of operational amplifier OP1 can converge to reference voltage VA while the drain current of MOS transistor M2 can be reduced to 1/2500 of the drain current of MOS transistor M1.

Further, it is preferable that both the output voltage of MOS transistor M1 when the LED is illuminating and the output voltage of MOS transistor M2 when the LED is not illuminating converge to reference voltage VA, however, the present invention is not limited thereto. For example, if the absolute value of the difference between the output voltage of MOS transistor M1 when the LED is illuminating and the output voltage of MOS transistor M2 when the LED is not illuminating is not more than 0.2V, the object of the invention can be achieved. Accordingly, if the condition is satisfied, MOS transistor M2 and resistor R2 can be shared among a plurality of LEDs.

Figure 4:
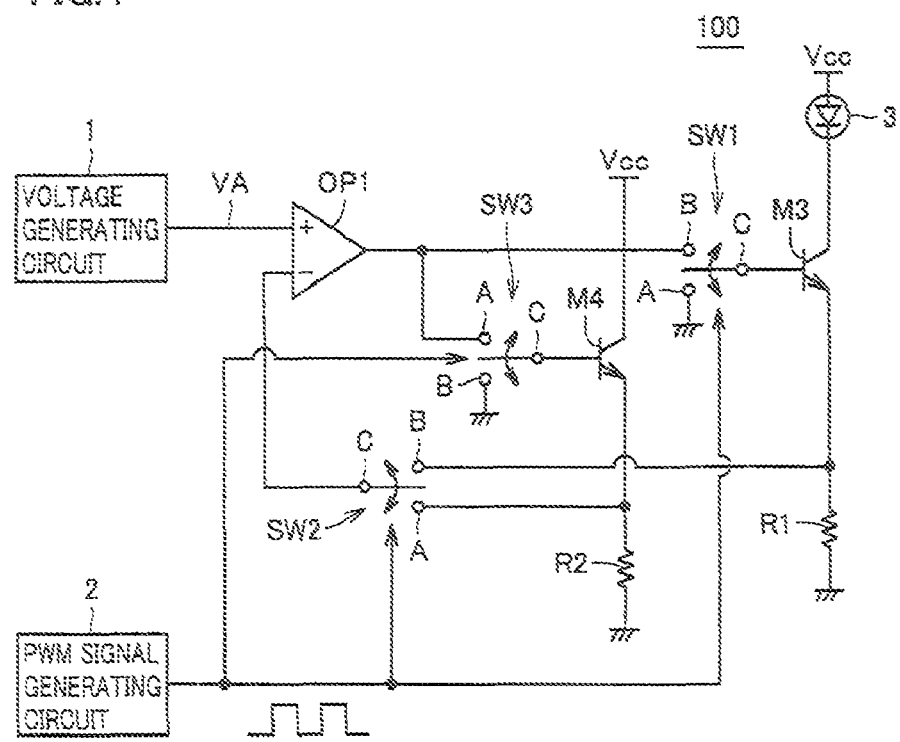
FIG. 4 is a diagram showing another configuration of the drive circuit according to the second embodiment of the present invention.

The drive circuit according to the present embodiment is configured to include MOS transistor M1 and MOS transistor M2, however, the present invention is not limited thereto and the drive circuit may be configured to include a bipolar transistor M3 and a bipolar transistor M4 instead of MOS transistor M1 and MOS transistor M2, as shown in FIG. 4.

[Semiconductor Integrated Circuit]

Figure 5:
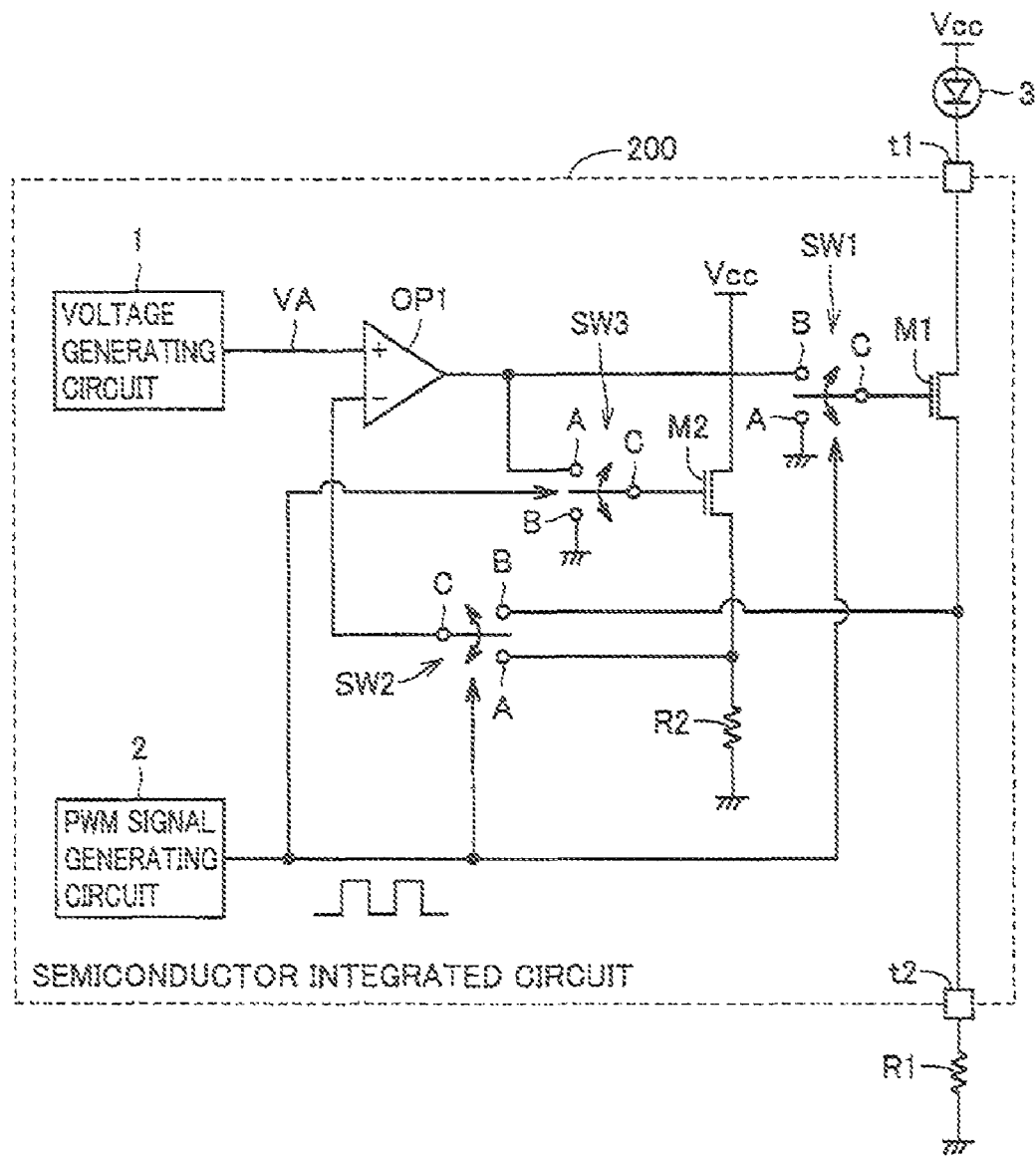
FIG. 5 is a configuration diagram when the drive circuit according to the second embodiment of the present invention is a semiconductor integrated circuit.

FIG. 5 is a configuration diagram when the drive circuit according to the present embodiment is a semiconductor integrated circuit.

Referring to FIG. 5, a semiconductor integrated circuit 200 includes switches SW1-SW3, operational amplifier OP1, MOS transistors M1-M2, resistor R2, voltage generating circuit 1, and PWM signal generating circuit 2.

Semiconductor integrated circuit 200 is different from the drive circuit shown in FIG. 3 in that MOS transistor M1 has a drain connected to a terminal t1 of semiconductor integrated circuit 200 and a source connected to a terminal t2 of semiconductor integrated circuit 200.

Outside semiconductor integrated circuit 200, an LED as load 3 is connected to terminal t1 and resistor R1 is connected to terminal t2. With such a configuration, even when there are variations in characteristics of the LED, the luminance of the LED can be adjusted by changing the resistance value of resistor R1. The drive circuit according to the first embodiment can be implemented as a semiconductor integrated circuit with such a configuration that the LED as load 3 is connected to terminal t1 and resistor R1 is connected to terminal t2 outside the semiconductor integrated circuit.

Semiconductor integrated circuit 200 is used as an LED driver. The drive circuit according to the present embodiment is in particular very effective when used as backlight for an LCD display device employing a known field sequential method where high speed switching of the LED between the illuminating state and the non-illuminating state is required, since stable luminance and chromaticity can be obtained.

[Portable Information Terminal]

Figure 6:
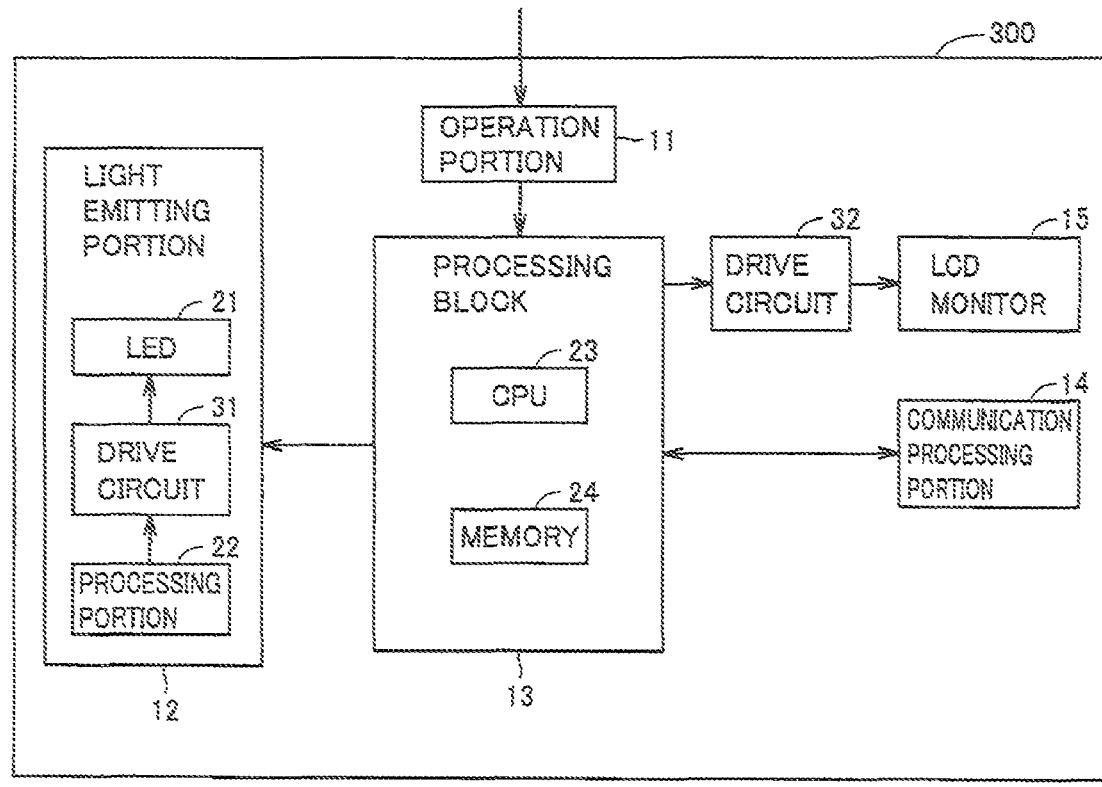
FIG. 6 is a functional block diagram of a portable information terminal having the drive circuit according to the second embodiment of the present invention.

FIG. 6 is a functional block diagram of a portable information terminal having a drive circuit according to the present embodiment.

Referring to FIG. 6, a portable information terminal 300 includes drive circuits 31-32, an operation portion 11, a light emitting portion 12, a processing block 13, a communication processing portion 14, and an LCD monitor 15. Light emitting portion 12 includes an LED 21 and a processing portion 22, and processing block 13 includes a CPU (Central Processing Unit) 23 and a memory 24. Drive circuits 31-32 correspond to drive circuit 100.

Hereinafter, description will be given assuming that portable information terminal 300 is a mobile phone. However, portable information terminal 300 may be a PDA or the like.

Communication processing portion 14 performs a process necessary for communication. More specifically, communication processing portion 14 performs a process necessary for communication in a mobile communication system such as a PDC (Personal Digital Cellular System), a personal handy-phone system, and a CDMA (Code Division Multiple Access) method.

Operation portion 11 includes a button for a user to input a telephone number or the like and detects an operation by the user.

Light emitting portion 12 causes LED 21 to blink as illumination when the mobile phone receives a call. Processing portion 22 performs a process for causing LED 21 to blink. More specifically, processing portion 22 outputs a control signal representing an instruction to cause LED 21 to blink to PWM signal generating circuit 2 included in drive circuit 31. Then, drive circuit 31 supplies a current to LED 21 based on the control signal received from processing portion 22 to cause LED 21 to blink. Processing block 13 controls each block of the mobile phone.

LCD monitor 15 displays a telephone number of a party with which communication has been established, content of an e-mail, an image or the like. Herein, processing block 13 displays an image or the like on LCD monitor 15 while outputting a control signal to PWM signal generating circuit 2 in drive circuit 32. Then, drive circuit 31 supplies a current to the LED included in LCD monitor 15 based on the control signal received from processing block 13.

To note, the drive circuit according to the first embodiment can also be applied to drive circuits 31-32 in portable information terminal 300.

Then, another embodiment of the present invention will be described with reference to the drawings. In the drawings, the same reference characters refer to the same or corresponding elements and description thereof will not be repeated here.

Third Embodiment

Figure 7:
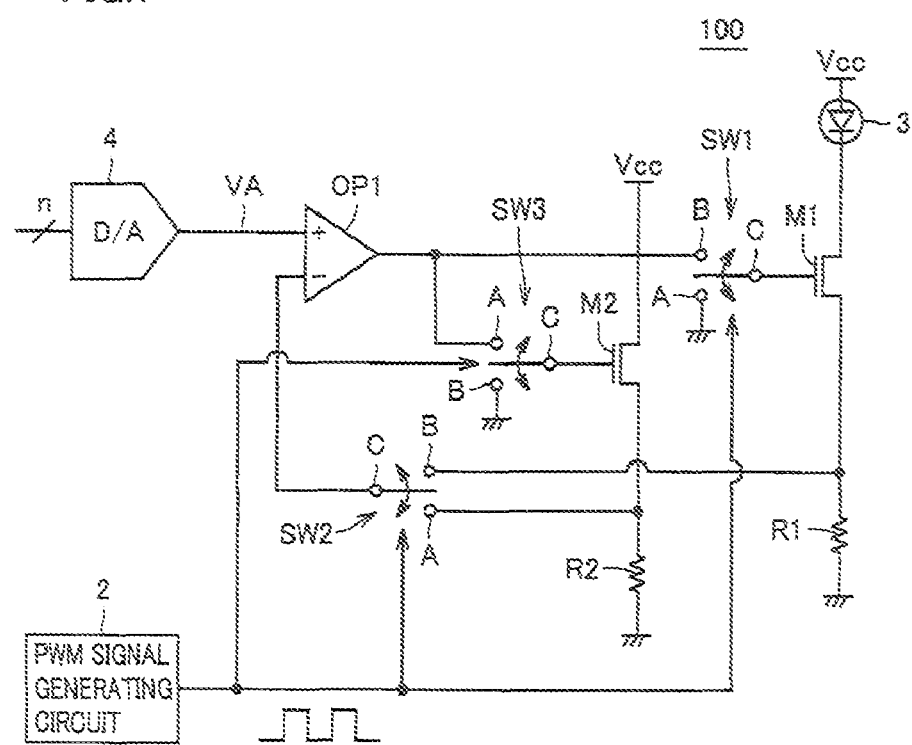
FIG. 7 is a diagram showing a configuration of a drive circuit according to a third embodiment of the present invention.

FIG. 7 is a diagram showing a configuration of a drive circuit according to a third embodiment of the present invention. Referring to FIG. 7, drive circuit 100 further includes a D/A converter 4, as compared with the drive circuit according to the second embodiment.

D/A converter 4 changes reference voltage VA based on data of n bits (n is a natural number of at least 2) received from the outside and supplies the changed reference voltage VA to the positive input terminal of operational amplifier OP1.

With such a configuration, in addition to the control of the output current of MOS transistor M1 by the PWM control signal, the gate voltage of MOS transistor M1, i.e. the drain current of MOS transistor M1 can be controlled with resolution of n bits. Accordingly, the drive circuit according to the present embodiment can control the current supplied to load 3 more minutely than the drive circuit according to the second embodiment.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

For example, in the foregoing description, only the case where there is a single LED has been described, however, the drive circuit according to the embodiments of the present invention can be used for backlight of white or any chromaticity (chroma) if the drive circuit according to the embodiments of the present invention controls LEDs of R (red), G (green), B (blue) or the like.

What is claimed is:

1. A drive circuit to adjust a luminance of a light emitting element based on a PWM signal, comprising:
   a PWM signal generating circuit to generate the PWM signal;
   an operational amplifier to compare a voltage applied to a first input terminal with a reference voltage applied to a second input terminal;
   a transistor, having an output connected to the first input terminal of the operational amplifier, to supply a current to the light emitting element depending on a comparison result of the operational amplifier; and
   a switch to switch, based on the PWM signal, between
      a first state of conduction of a path providing the comparison result of the operational amplifier to the transistor and non-conduction of a path providing a predetermined voltage to the transistor to turn on the transistor, and
      a second state of non-conduction of the path providing the comparison result of the operational amplifier to the transistor and conduction of the path providing the predetermined voltage to the transistor to turn off the transistor.

2. The drive circuit according to claim 1 wherein the predetermined voltage is a ground voltage.

3. The drive circuit according to claim 1 further comprising a D/A converter to change the reference voltage based on input data and apply the changed reference voltage to the second input terminal of the operational amplifier.

4. The drive circuit according to claim 1 wherein the light emitting element is arranged for providing backlight for a field sequential display device.

5. The drive circuit according to claim 1 wherein the transistor is a MOS transistor.

6. The drive circuit according to claim 1 wherein the transistor is a bipolar transistor.

7. A portable information terminal comprising the drive circuit of claim 1.

8. A drive circuit to adjust a luminance of a light emitting element based on a PWM signal, comprising:
   a PWM signal generating circuit to generate the PWM signal;
   an operational amplifier to compare a voltage applied to a first input terminal with a reference voltage applied to a second input terminal;
   a transistor, having an output connected to the first input terminal of the operational amplifier, to supply a current to the light emitting element depending on a comparison result of the operational amplifier;
   a first switch turned on in response to the PWM signal being at a first logical level to provide the comparison result of the operational amplifier to the transistor and turned off in response to the PWM signal being at a second logical level; and
   a second switch turned on in response to the PWM signal being at the second logical level to provide a predetermined voltage to the transistor and turn off the transistor in response to the PWM signal being at the first logical level.

9. The drive circuit according to claim 8 wherein the predetermined voltage is a ground voltage.

10. The drive circuit according to claim 8 further comprising a D/A converter to change the reference voltage based on input data and apply the changed reference voltage to the second input terminal of the operational amplifier.

11. The drive circuit according to claim 8 wherein the light emitting element is arranged for providing backlight for a field sequential display device.

12. The drive circuit according to claim 8 wherein the transistor is a MOS transistor.

13. The drive circuit according to claim 8 wherein the transistor is a bipolar transistor.

14. A portable information terminal comprising the drive circuit of claim 8.

15. The drive circuit according to claim 8 wherein, in response to the PWM signal being at the first logical level, the first switch is turned on to render conductive a path providing the comparison result of the operational amplifier to the transistor, and the second switch is turned off to render non-conductive a path providing a predetermined voltage to the transistor to turn on the transistor, and
   wherein in response to the PWM signal being at the second logical level, the first switch is turned off to render non-conductive the path providing the comparison result of the operational amplifier to the transistor, and the second switch is turned on to render conductive the path providing the predetermined voltage to the transistor to turn off the transistor.

* * * * *